(12) United States Patent
Li et al.

(10) Patent No.: US 11,611,323 B2
(45) Date of Patent: Mar. 21, 2023

(54) AUTOMATIC GAIN CONTROL CIRCUIT

(71) Applicant: TEXAS INSTRUMENTS INCORPORATED, Dallas, TX (US)

(72) Inventors: Qunying Li, Allen, TX (US); Shanmuganand Chellamuthu, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 723 days.

(21) Appl. No.: 16/591,288

(22) Filed: Oct. 2, 2019

(65) Prior Publication Data

US 2021/0104991 A1 Apr. 8, 2021

(51) Int. Cl.
*H03F 3/45* (2006.01)
*H03G 3/30* (2006.01)
*G01D 5/14* (2006.01)

(52) U.S. Cl.
CPC .......... *H03G 3/30* (2013.01); *G01D 5/14* (2013.01); *H03F 3/45174* (2013.01); *H03F 3/45085* (2013.01)

(58) Field of Classification Search
CPC ........ H03G 3/30; G01D 5/14; H03F 3/45174; H03F 2203/45008; H03F 2203/45082; H03F 2203/45418; H03F 3/45085; H03F 3/45183; H03F 3/45098
USPC .................................................. 330/252–261
See application file for complete search history.

(56) References Cited

U.S. PATENT DOCUMENTS

| | | | | |
|---|---|---|---|---|
| 6,639,473 | B1 * | 10/2003 | Kobayashi | H03F 3/08 330/252 |
| 7,279,984 | B2 * | 10/2007 | Grillo | H03F 3/45183 330/253 |
| 7,791,400 | B2 | 9/2010 | Li | |
| 2018/0073895 | A1 | 3/2018 | Chellamuthu et al. | |

* cited by examiner

*Primary Examiner* — Hafizur Rahman
*Assistant Examiner* — Khiem D Nguyen
(74) *Attorney, Agent, or Firm* — John R. Pessetto; Frank D. Cimino

(57) ABSTRACT

An automatic gain control circuit includes a linear-to-log conversion circuit, a current amplifier circuit, and an amplitude sense circuit. The current amplifier circuit includes a current input terminal coupled to an output terminal of the linear-to-log conversion circuit. The amplitude sense circuit includes an input terminal coupled to an output terminal of the current amplifier circuit, and an output terminal coupled to a gain control input terminal of the current amplifier circuit.

20 Claims, 6 Drawing Sheets

AUTOMATIC GAIN CONTROL CIRCUIT

BACKGROUND

Automatic gain control circuits are employed in a variety of applications to dynamically control the amplitude of an incoming signal. For example, an automatic gain control circuit may be applied to adjust the amplitude of an incoming analog signal for maximizing the dynamic range of a subsequent circuit. Automatic gain control circuits can employ an automatic gain control component that compares an output signal of the automatic gain control circuit to a reference value that represents a desired signal amplitude. Error signals are generated based on the comparison, and the error signals are applied to adjust the amplitude of the output of the automatic gain control circuit.

SUMMARY

An analog automatic gain control circuit that provides quick gain adjustment is disclosed herein. In one example, an automatic gain control circuit includes a linear-to-log conversion circuit, a current amplifier circuit, and an amplitude sense circuit. The current amplifier circuit includes a current input terminal coupled to an output terminal of the linear-to-log conversion circuit. The amplitude sense circuit includes an input terminal coupled to an output terminal of the current amplifier circuit, and an output terminal coupled to a gain control input terminal of the current amplifier circuit.

In another example, an automatic gain control circuit includes a linear-to-log conversion circuit, a current amplifier circuit, an amplitude sense circuit, and a capacitor. The linear-to-log conversion circuit is configured to convert differential input signal to a differential output signal that is a logarithmic function of the differential input signal. The current amplifier circuit is coupled to the linear-to-log conversion circuit, and is configured to apply a gain to the differential output signal to produce a differential output signal. The amplitude sense circuit is coupled to the current amplifier circuit, and configured to compare the differential output signal to a target voltage, and generate a gain control signal based on a difference of the differential output signal and the target voltage. The capacitor is coupled to the current amplifier circuit and the amplitude sense circuit, the capacitor is configured to average the gain control signal over time, and provide an average gain control signal to the current amplifier circuit to set the gain.

In a further example, an angular position sensor circuit includes an input terminal, analog front-end circuitry, and an automatic gain control circuit. The analog front-end circuitry is coupled to the input terminal. The automatic gain control circuit is coupled to the analog front-end circuitry and includes a linear-to-log conversion circuit, a current amplifier circuit, an amplitude sense circuit, and a capacitor. The current amplifier circuit includes a current input terminal coupled to an output terminal of the linear-to-log conversion circuit. The amplitude sense circuit includes an input terminal coupled to an output terminal of the current amplifier circuit, and an output terminal coupled to a gain control input terminal of the current amplifier circuit. The capacitor is coupled to the output terminal of the amplitude sense circuit.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Angular position sensors are one of many applications that employ automatic gain control (AGC) circuits. In an angular position sensor, the AGC circuit continuously maintains the sensor output signals (for example: sine and cosine signals) at a predetermined amplitude that optimizes dynamic range for angle resolution.

Some AGC circuits apply digital circuitry to control the gain applied to a received signal. For example, an AGC circuit implementation may include a programmable gain amplifier (PGA) that includes one or more digital-to-analog converters (DACs) used as programmable resistors to set the gain of the amplifier. A processor, such as a digital signal processor, coupled to the DACs provides a digital value that sets the resistance of the DACs, and thus sets the gain of the PGA. Sensing circuitry coupled to the processor compares the amplitude of PGA output to one or more threshold voltages. The processor selects the digital value provided to the PGA based on results of the comparison(s) by the sensing circuitry. For slowly changing input signal amplitude, such an AGC circuit may respond fast enough to maintain the output at the target level. However, for fast changing input signal amplitude the response time may be too slow to maintain the output at the target level.

Figure 1:
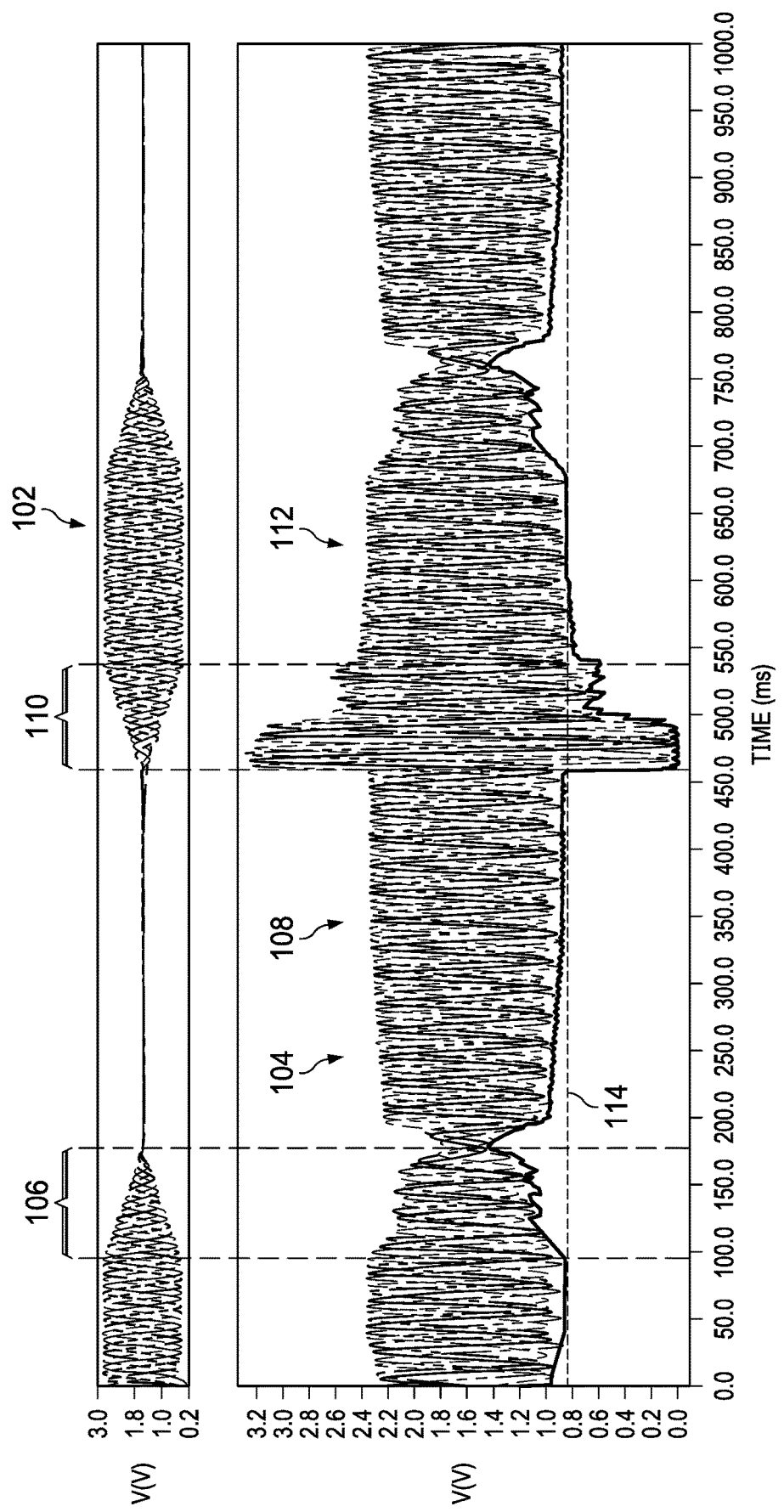
FIG. 1 shows example signals produced using an automatic gain control circuit that controls gain digitally.

FIG. 1 shows example signals produced using an automatic gain control circuit that controls gain digitally. In the interval 106, the amplitude of the input signal 102 changes from 2.4 volts peak-to-peak to 100 millivolts peak-to-peak. The AGC circuit responds too slowly to maintain the desired amplitude of the output signal 104. In FIG. 1, the AGC circuit restores the amplitude of the output signal 104 to the desired amplitude 114 at about 108 (about 250 microseconds after amplitude of the input signal 102 begins to fall). Similarly, in the interval 110, the amplitude of the input signal 102 increases from 100 millivolts peak-to-peak to 2.4 volts peak-to-peak. The AGC circuit responds too slowly to maintain the desired amplitude 114 of the output signal 104. In FIG. 1, the AGC circuit restores the amplitude of the output signal 104 to desired amplitude 114 at about 112 (about 140 microseconds after amplitude of the input signal 102 begins to increase).

The analog AGC circuit disclosed herein provides faster response than a digitally controlled AGC circuit while increasing both input and output signal range. Additionally, the circuit of the present disclosure is more compact than a digital AGC circuit.

Figure 2:
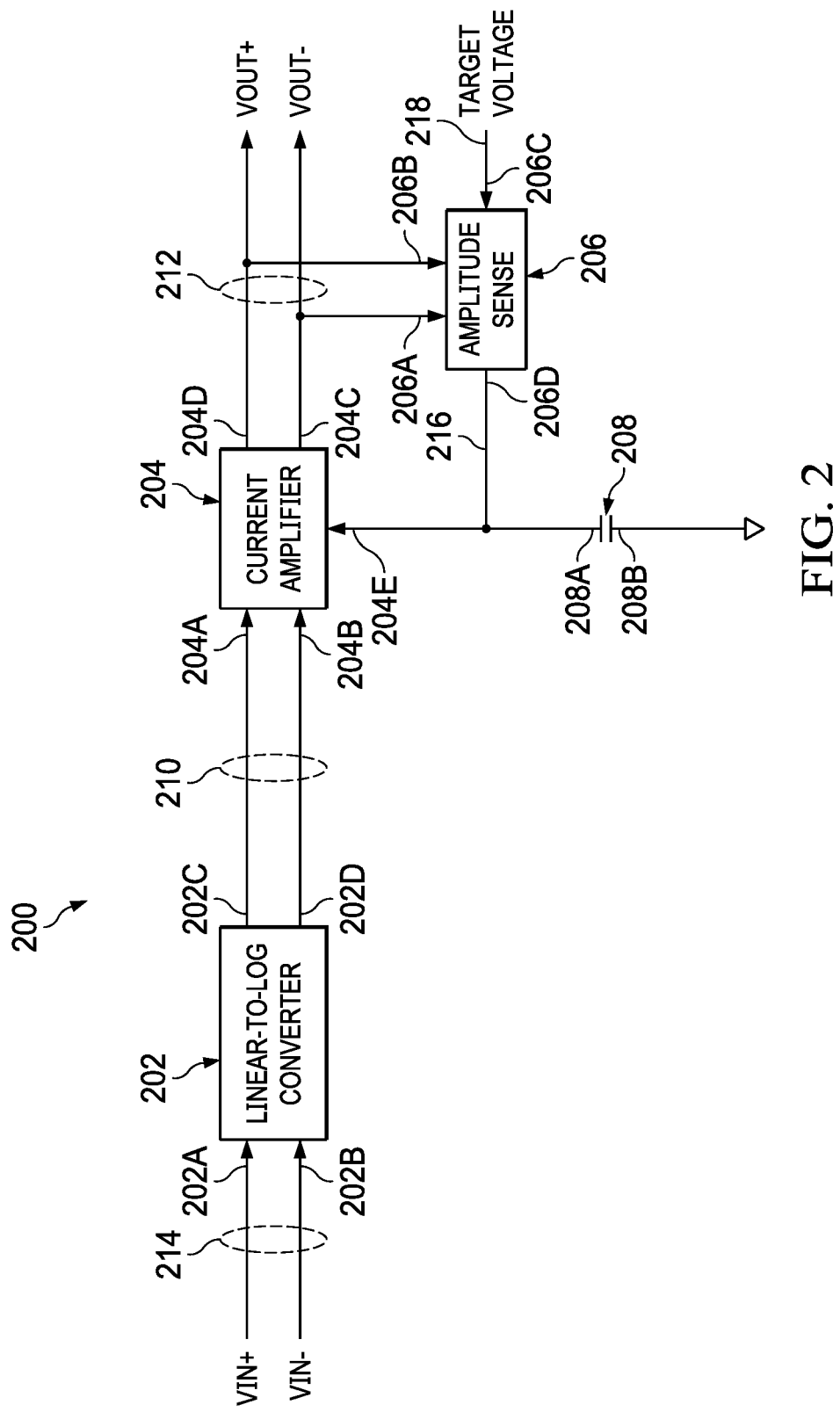
FIG. 2 shows a block diagram for an example analog automatic gain control circuit in accordance with this description.

FIG. 2 shows a block diagram for an example analog automatic gain control circuit 200 in accordance with this description. The analog automatic gain control circuit 200 includes a linear-to-log conversion circuit 202, a current amplifier circuit 204, an amplitude sense circuit 206, and a capacitor 208. The linear-to-log conversion circuit 202 includes signal input terminals 202A and 202B for receipt of a differential signal 214 ($V_{IN}+-V_{IN}-$). The linear-to-log conversion circuit 202 converts the differential signal 214 to a differential output signal 210 having amplitude that is a logarithmic function of the amplitude of the differential signal 214. The log format differential output signal 210 generated by the linear-to-log conversion circuit 202 is provided to the current amplifier circuit 204.

The current amplifier circuit 204 includes input terminals 204A and 204B respectively coupled to output terminals 202C and 202D of the linear-to-log conversion circuit 202 for receipt of the differential output signal 210. The current amplifier circuit 204 applies gain to the differential output signal 210 to produce the differential output signal 212 and maintain the amplitude of the differential output signal 212 at a desired level. The differential output signal 212 is linear with respect to the differential signal 214. The differential output signal 212 is provided to the amplitude sense circuit 206, and to other circuitry for further processing according to the application in which the analog automatic gain control circuit 200 is used.

The amplitude sense circuit 206 includes input terminals 206A and 206B respectively coupled to output terminals 204C and 204D of the current amplifier circuit 204 for receipt of the differential output signal 212. The amplitude sense circuit 206 compares the differential output signal 212 to a target voltage 218. The amplitude sense circuit 206 receives the target voltage 218 at the input terminal 206C. Based on the difference in amplitude of the differential output signal 212 and the target voltage 218, the amplitude sense circuit 206 generates a gain control signal 216. The gain control signal 216 is provided at the output terminal 206D of the amplitude sense circuit 206.

The capacitor 208 is coupled to the amplitude sense circuit 206 and the current amplifier circuit 204. The capacitor 208 averages the gain control signal 216 for application by the current amplifier circuit 204. The capacitor 208 includes a terminal 208A coupled the output terminal 206D of the amplitude sense circuit 206 and a gain control input terminal 204E of the current amplifier circuit 204. The capacitor 208 also includes a terminal 208B coupled to a common voltage source, such as ground. The average of the gain control signal 216 (average gain control signal) provided by the capacitor 208 controls the gain of the current amplifier circuit 204.

For example, if the amplitude of the differential output signal 212 is less than the target voltage 218, the amplitude sense circuit 206 generates the gain control signal 216 to charge the capacitor 208. The voltage across the capacitor 208 rises and the gain of the current amplifier circuit 204 increases. If the amplitude of the differential output signal 212 is greater than the target voltage 218, the amplitude sense circuit 206 generates the gain control signal 216 to discharge the capacitor 208. The voltage across the capacitor 208 falls and the gain of the current amplifier circuit 204 decreases. The voltage across the capacitor 208 is continually adjusted until the amplitude of the differential output signal 212 equals the target voltage 218. Compared to digital AGC circuits, in the analog automatic gain control circuit 200 sensed amplitude is directly applied to control the gain of the current amplifier circuit 204. Furthermore, the gain of the current amplifier circuit 204 has an exponential relation with voltage across the capacitor 208, and the circuit response time is much faster than a digital AGC circuit, which is limited by PGA bandwidth and processor pace control.

Figure 3A:
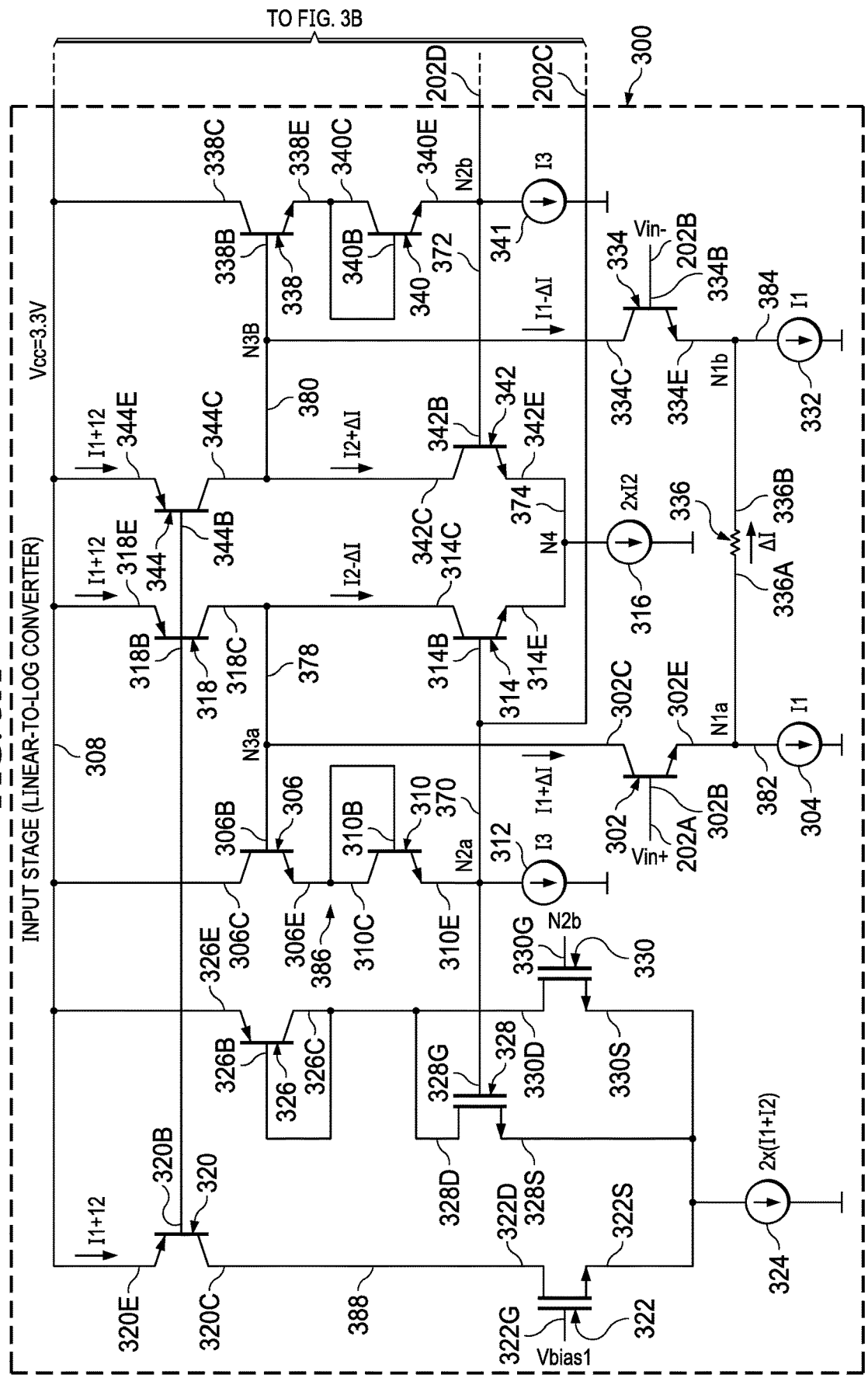
FIG. 3A shows a schematic diagram for an example linear-to-log conversion circuit suitable for use in an analog automatic gain control circuit in accordance with this description.

FIG. 3A shows a schematic diagram for an example linear-to-log conversion circuit 300 suitable for use in an implementation of the analog automatic gain control circuit 200. The linear-to-log conversion circuit 300 is an implementation of the linear-to-log conversion circuit 202. The linear-to-log conversion circuit 300 includes signal input transistors 302 and 334, input range control circuitry 386, and output range control circuitry 388. A base terminal 302B of the signal input transistor 302 is coupled to the signal input terminal 202A, and an emitter terminal 302E of the signal input transistor 302 is coupled to a current source 304. Similarly, a base terminal 334B of the signal input transistor 334 is coupled to the signal input terminal 202B, and an emitter terminal 334E of the signal input transistor 334 is coupled to a current source 332. A resistor 336 includes a terminal 336A coupled to the emitter terminal 302E of the signal input transistor 302 and a terminal 336B coupled to the emitter terminal 334E of the signal input transistor 334.

A collector terminal 302C of the signal input transistor 302 is coupled to a base terminal 306B of a transistor 306. A collector terminal 306C of the transistor 306 is coupled to a power supply rail 308, and an emitter terminal 306E of the transistor 306 is coupled to a collector terminal 310C and a base terminal 310B of a diode-connected transistor 310. An emitter terminal 310E of the diode-connected transistor 310 is coupled to a current source 312, the input terminal 204A, and a base terminal 314B of the transistor 314. An emitter terminal 314E of the transistor 314 is coupled a current source 316, and a collector terminal 314C of the transistor 314 is coupled to the base terminal 306B of the transistor 306 and a collector terminal 318C of the transistor 318. An emitter terminal 318E of the transistor 318 is coupled to the power supply rail 308.

A collector terminal 334C of the signal input transistor 334 is coupled to a base terminal 338B of a transistor 338. A collector terminal 338C of the transistor 338 is coupled to the power supply rail 308, and an emitter terminal 338E of the transistor 338 is coupled to a collector terminal 340C and a base terminal 340B of a diode-connected transistor 340. An emitter terminal 340E of the diode-connected transistor 340 is coupled to a current source 341, the output terminal 202D, and a base terminal 342B of the transistor 342. An emitter terminal 342E of the transistor 342 is coupled to the current source 316, and a collector terminal 342C of the transistor 342 is coupled to the base terminal 338B of the transistor 338 and a collector terminal 344C of the transistor 344. An emitter terminal 344E of the transistor 344 is coupled to the power supply rail 308.

The linear-to-log conversion circuit 300 converts the differential signal 214 ($\Delta V_{IN}=(V_{IN}+)-(V_{IN}-)$) into log scale voltages 370 and 372 that are provided to the current amplifier circuit 204 for amplification. When $V_{IN}+=V_{IN}-$, the currents in the signal input transistors 302 and 334 (current I1 in each) and the currents in the transistors 314 and 342 (I2 in each) are balanced with the currents in the transistors 318 and 344 (current I1+I2 in each). When a non-zero input Vin+=Vincm+ΔVin/2 and Vin−=Vincm−ΔVin/2 is received at the signal input terminals 202A and 202B, the input signal is converted into current ΔI as follows.

$$\Delta I = \frac{[(V_{IN}+) - V_{be}(Q_{1a}) - (V_{IN}-) + V_{be}(Q_{1b})]}{R_{IN}} = \frac{\Delta V_{IN}}{R_{IN}} \quad (1)$$

where:
$V_{be}(Q_{1a})$ is base-emiter voltage of the signal input transistor 302;
$V_{be}(Q_{1b})$ is base-emiter voltage of the signal input transistor 334; and
$R_{IN}$ is resistance of the resistor 336.

In equation(1), the input current ΔI modulation effect on Vbe(Q1a) and Vbe(Q1b) can be ignored if the tail current I1>=2.2*max(ΔI), i.e. the resulting distortion is small enough and the linearity spec is met. The input current +/−ΔI is forced into transistors 314 and 342, which are in diode connection respectively through DC level-shifters comprising transistors 306 and 310, and transistors 338 and 340. Thus, for transistor 314:

$$(I2 - \Delta I) = I_{SS} * e^{\left[\frac{V_{be}(Q_{2a})}{V_t}\right]}, \quad (2A)$$

and for transistor 342:

$$(I2 + \Delta I) = I_{SS} * e^{\left[\frac{V_{be}(Q_{2b})}{V_t}\right]} \quad (2B)$$

Rewriting equations (2A) and (2B) for $V_{be}(Q2a)$ and $V_{be}(Q2b)$ in a log-format of ΔVin produces:

$$V_{be}(Q_{2a}) = V_t * \log_e \frac{I2 - \Delta I}{I_{SS}} = V_t * \log_e \frac{I2 - \frac{\Delta V_{IN}}{R_{IN}}}{I_{SS}} \quad (3A)$$

and $$V_{be}(Q_{2b}) = V_t * \log_e \frac{I2 + \Delta I}{I_{SS}} = V_t * \log_e \frac{I2 + \frac{\Delta V_{IN}}{R_{IN}}}{I_{SS}} \quad (3B)$$

The linear-to-log conversion circuit 300 also increases (e.g., maximizes) the input and output signal range of the linear-to-log conversion circuit 202 and the current amplifier circuit 204. In some implementations of the linear-to-log conversion circuit 300, the output range is maximized by biasing nodes 370 and 372 at about 1.1V, so that node 374 (1*Vbe down from 1.1V) is at low potential around 300 mV, which provides not only enough headroom for tail current '2I2', but also makes the output signal Vout+/Vout− (FIG. 3B) swing range as large as possible.

The output range control circuitry 388 biases nodes 370 and 372 at about 1.1V as follows. The common mode level of nodes 370 and 372 is sensed by transistors 328 and 330, and the sensed output common mode voltage is compared to Vbias1 (e.g., 1.1 v), which is provided at the gate terminal 322G of the transistor 322. If the voltage at the nodes 370 and 372 moves lower than Vbias1, then more current flows in the transistors 320 and 322 from the tail '2(I1+I2)' than the transistors 326, 328, and 330, resulting in the current in transistors 318 and 344 increasing and pulling up nodes 378 and 380 as well as nodes 370 and 372 through the level-shifter made of transistors 306 and 310 and the level-shifter made up of the transistors 338 and 340. If the voltage at nodes 370 and 372 moves higher than Vbias1, then less current flows in the transistors 320 and 322, and voltage at the nodes 370 and 372 is reduced.

The diode-connected transistor 320 includes an emitter terminal 320E coupled to the power supply rail 308, a base terminal 320B coupled to the base terminal 318B of the transistor 318 and the base terminal 344B of the transistor 344. The collector terminal 320C of the diode-connected transistor 320 is coupled to a drain terminal 322D of the transistor 322. A source terminal 322S of the transistor 322 is coupled to a current source 324. The diode-connected transistor 326 includes an emitter terminal 326E coupled to the power supply rail 308, and a collector terminal 326C coupled to a drain terminal 328D of the transistor 328 and a drain terminal 330D of the 330. The gate terminal 328G of the transistor 328 is coupled to the emitter terminal 310E of the diode-connected transistor 310, and the source terminal 328S of the transistor 328 is coupled to the current source 324. The gate terminal 330G of the transistor 330 is coupled the emitter terminal 340E of the diode-connected transistor 340, and the source terminal 330S of the transistor 330 is coupled to the current source 324.

The input range control circuitry 386 is coupled to the signal input transistors 302 and 334 and controls (e.g., maximizes) the input signal range as follows. The level shifter comprising the transistor 306 and the diode-connected transistor 310, and the level shifter comprising the transistor 338 and the diode-connected transistor 340 maintain nodes 378 and 380 at a common mode potential about 2*Vbe=1.6V higher than the voltage at nodes 370 and 372, e.g., about 2.7V, which is 0.6V below Vdd (where Vdd is 3.3V) and provides enough Vce headroom for operation of the transistors 318 and 344. In some implementations, Vdd is nominally 3.3V, and may be as low as 3.0V, in which case there is still 0.3V of headroom for the transistors 318 and 340 to be in normal operation. The described circuit arrangement allows nodes 378 and 380 to reach about 2.7V and provides a large headroom for the signal input transistors 302 and 334. The input swings are Vin+/−=Vincm+/−ΔVin=2.1V+/−1V and the signal swings at nodes 382 and 384 are 1.4V+/−1V allowing both signal input transistors 302 and 334 and their two tail currents 'I1' to operate normally.

Figure 3B:
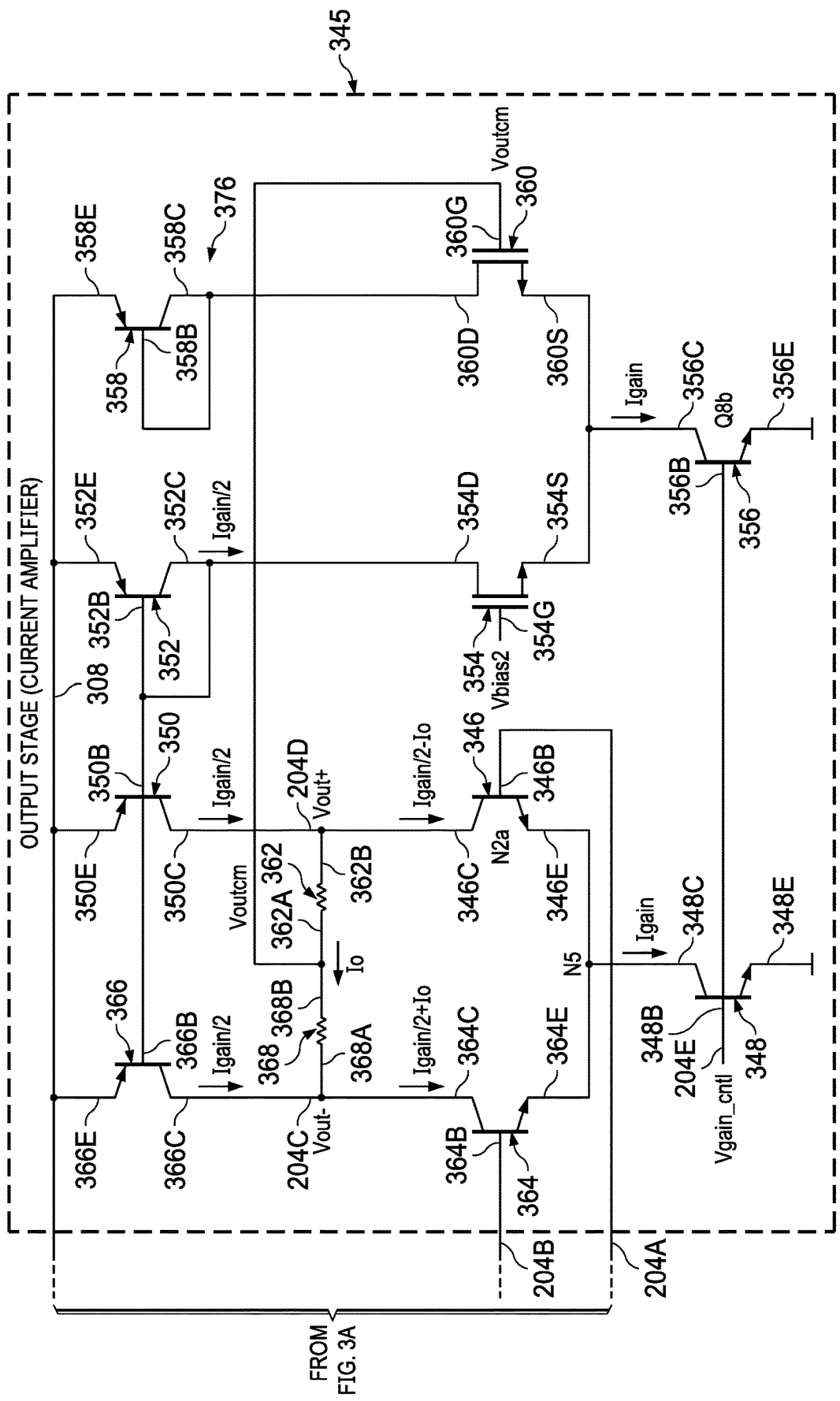
FIG. 3B shows a schematic diagram for an example current amplifier circuit suitable for use in an analog automatic gain control circuit in accordance with this description.

FIG. 3B shows a schematic diagram for an example current amplifier circuit 345 suitable for use in an analog automatic gain control circuit 200. The current amplifier circuit 345 is coupled to the linear-to-log conversion circuit 300 and amplifies the log signals received from the linear-to-log conversion circuit 300. The current amplifier circuit 345 is an implementation of the current amplifier circuit 204. The current amplifier circuit 345 includes transistor 346 and transistor 364 coupled as a differential pair. A base terminal 346B of the transistor 346 is coupled to the input terminal 204A, and a base terminal 364B of the transistor 364 is coupled to the input terminal 204B for reception of signal to be amplified. A collector terminal 346C of the transistor 346 is coupled to the output terminal 204D, and a collector terminal 364C of the transistor 364 is coupled to the output terminal 204C. An emitter terminal 346E of the transistor 346 is coupled to an emitter terminal 364E of the transistor 364 and to the collector terminal 348C of the transistor 348. The transistor 348 controls the gain of the current amplifier circuit 345 responsive to the gain control signal 216 received from the amplitude sense circuit 206. A base terminal 348B of the transistor 348 is coupled to the gain control input terminal 204E, and an emitter terminal 348E of the transistor 348 is coupled to a common voltage source, such as ground. The output currents of the collector terminals of the transistor 346 and the transistor 364 become linear with ΔVin of the linear-to-log conversion circuit 300 because of the exponential relation between Vbe and Ic of a bipolar transistor.

The tail current 'Igain' in the transistor 348 is directly controlled by voltage across the averaging capacitor 208 (i.e., the averaged gain control signal 216). The gains provided by the transistors 346 and transistor 364 are proportional to the tail current 'Igain' and an exponential function of the base-emitter voltage of the transistor 348 (i.e., the voltage across the capacitor 208). Thus, the gain of the current amplifier circuit 345 may change rapidly to respond to any variation in the input signal. The curent 'Igain' is also mirrored to the transistors 350 and 366 through transistor 356 and the output common mode circuitry 376 described below. The transistor 350 includes a collector terminal 350C coupled to a collector terminal 346C of the transistor 346, and an emitter terminal 350E coupled to the power supply rail 308. The transistor 366 includes a collector terminal 366C coupled to a collector terminal 364C of the transistor 364, and an emitter terminal 366E coupled to the power supply rail 308. The transistor 356 includes a base terminal 356B coupled to the base terminal 348B of the transistor 348, and an emitter terminal 356E coupled to the common voltage source.

The current amplifier circuit 345 includes output common mode circuitry 376 coupled to the transistor 346 and the transistor 364 that controls the common mode voltage at the output terminals 204C and 204D. The output common mode circuitry 376 compares the output common mode voltage to a reference voltage (Vbias2), and sets the current flowing in the transistor 346 and the transistor 364 to set the output common mode voltage to the reference voltage. The output common mode circuitry 376 includes transistor 356, transistor 354, transistor 360, transistor 352, transistor 358, transistor 350, and transistor 366. A source terminal 354S of the transistor 354 is coupled to the collector terminal 356C of the transistor 356, and a gate terminal 356G of the transistor 356 is coupled to a reference voltage source. The reference voltage source generates the voltage Vbias2. A source terminal 360S of the transistor 360 is coupled to the collector terminal 356C of the transistor 356, and a gate terminal 360G of the transistor 360 is coupled to the output resistors 362 and 368. The output resistor 362 includes a first terminal 362A coupled to the gate terminal 360G of the transistor 360, and a second terminal 362B coupled to the collector terminal 346C of the transistor 346. The output resistor 368 includes a first terminal 368A coupled to the collector terminal 364C of the transistor 364 and a second terminal 368B coupled to the terminal 362A of the output resistor 362. The output common mode voltage is sensed by the output resistors 362 and 368 (which also operate as a load to convert current output into voltage output of the current amplifier circuit 345).

A drain terminal 354D of the transistor 354 is coupled to a collector terminal 352C of the diode-connected transistor 352, and an emitter terminal 354E of the transistor 354 is coupled to the power supply rail 308. The base terminal 352B of the diode-connected transistor 352 is coupled to the base terminal 350B of the transistor 350 and the base terminal 366B of the transistor 366. The emitter terminal 352E of the diode-connected transistor 352 is coupled to the power supply rail 308. A drain terminal 360D of the transistor 360 is coupled to a collector terminal 358C of the diode-connected transistor 358. An emitter terminal 358E of the diode-connected transistor 358 is coupled to the power supply rail 308. When the output common mode voltage is less than Vbias2, more current flows in the transistors 352 and 354, and the current is mirrored in the transistors 350 and 366 to increase the output common mode voltage. Similarly, when the output common mode voltage is greater than Vbias2, less current flows in the transistors 352, 354, 350, and 366 to decrease the output common mode voltage.

Figure 4:
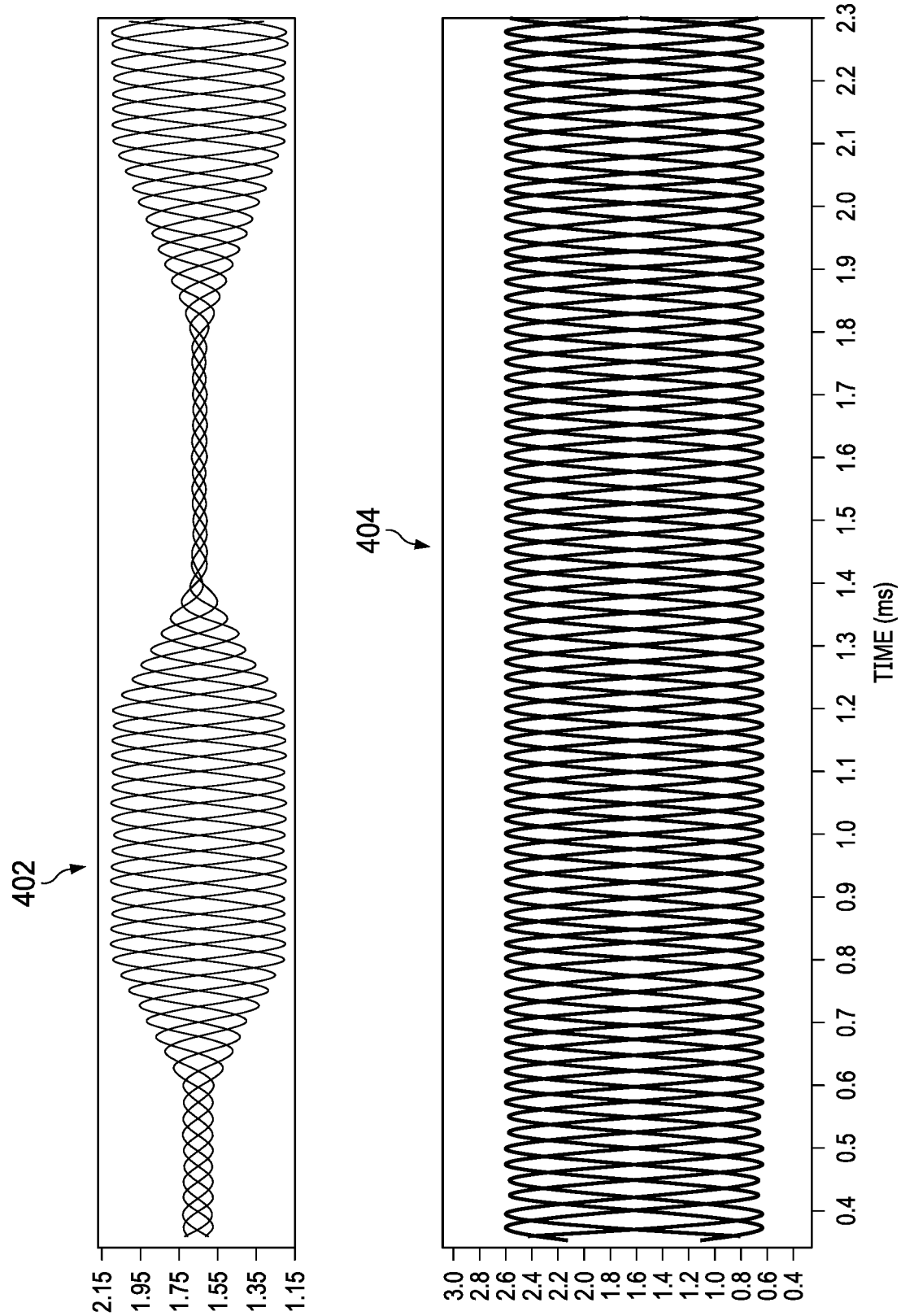
FIG. 4 shows example signals produced using an analog automatic gain control circuit in accordance with this description.

FIG. 4 shows example signals produced using the analog automatic gain control circuit 200. The input signal 402 is similar to the input signal 102 of FIG. 1. However, because the analog automatic gain control circuit 200 has much faster response than a digital AGC circuit, the transients in the output signal 404 (output of the analog automatic gain control circuit 200) are greatly reduced relative to the transients present in output signal 104 of FIG. 1.

Figure 5:
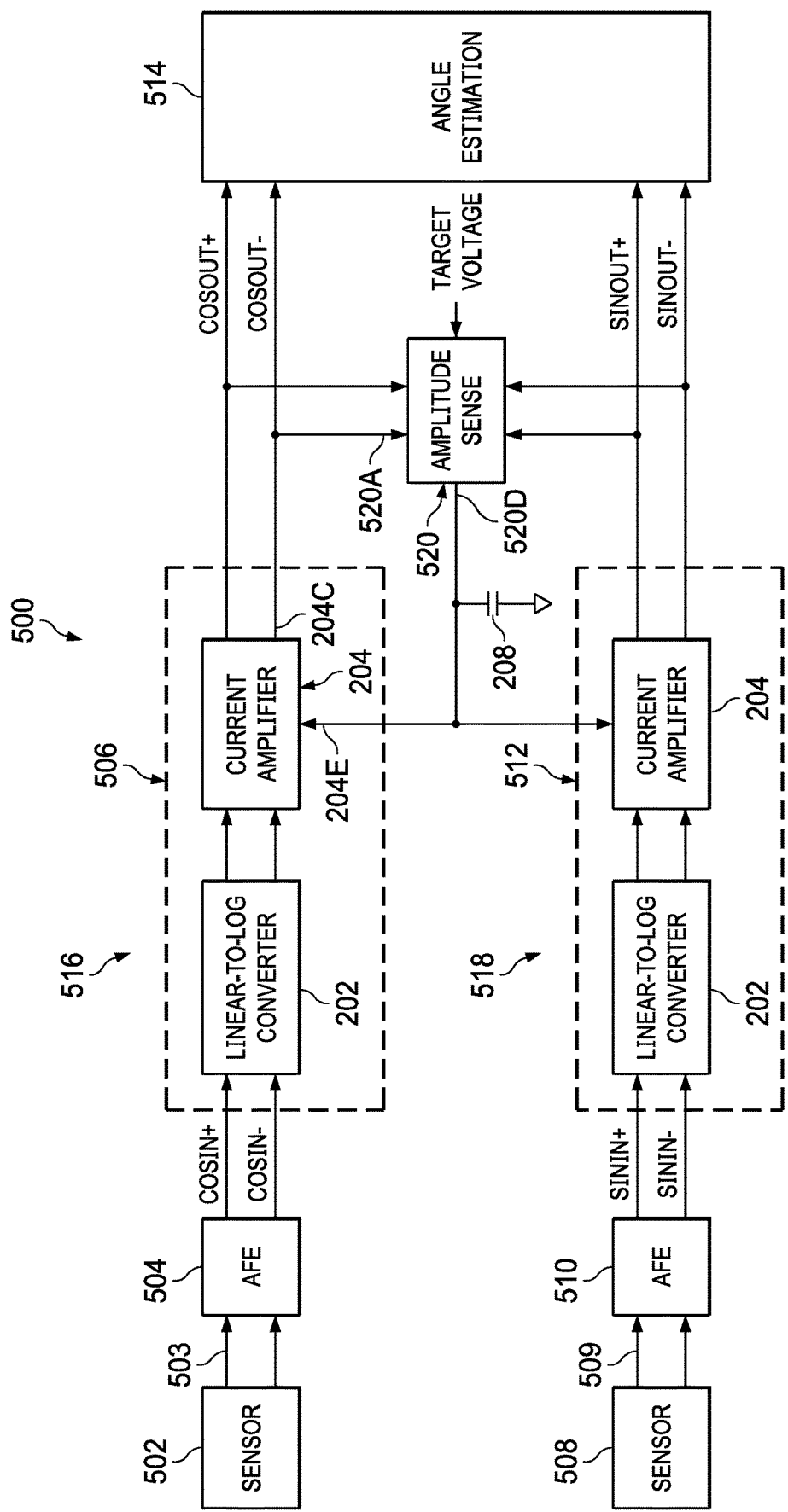
FIG. 5 shows a block diagram for an angular position sensor circuit in accordance with this description.

FIG. 5 shows a block diagram for an angular position sensor circuit 500 in accordance with this description. The angular position sensor circuit 500 includes a cosine channel 516, a sine channel 518, an amplitude sense circuit 520, a capacitor 208, and angle estimation circuitry 514. The amplitude sense circuit 520 is an implementation of the amplitude sense circuit 206 and generates an amplitude control signal based on the outputs of the cosine channel 516 and the sine channel 518. The capacitor 208 is coupled to output terminal 520D of the amplitude sense circuit 520 and averages a gain control signal generated by the amplitude sense circuit for controlling gain in the cosine channel 516 and the sine channel 518.

The angle estimation circuitry 514 generates angle measurement values based on the cosine and sine signals received from the cosine channel 516 and the sine channel 518. The angle estimation circuitry 514 may include analog-to-digital converters to digitize the signals output by the cosine channel 516 and the sine channel 518, and a processor to compute an angle value based on the digitized outputs.

The cosine channel 516 includes a sensor 502 (e.g. a hall effect sensor), an input terminal 503, analog front end (AFE) circuitry 504, and a cosine AGC circuit 506. The AFE circuitry 504 is coupled to the input terminal 503 for receipt of cosine signals from the sensor 502 and may include bandpass filter circuitry to limit the bandwidth of signal provided to the cosine AGC circuit 506. The cosine AGC circuit 506 includes an instance of the linear-to-log conversion circuit 202 coupled to the AFE circuitry 504 and an instance of the current amplifier circuit 204 coupled to the linear-to-log conversion circuit 202. The current amplifier circuit 204 is coupled to the amplitude sense circuit 520 and the angle estimation circuitry 514. The current amplifier circuit 204 includes an output terminal 204C coupled to an input terminal 520A of the amplitude sense circuit 520, where the input terminal 520A corresponds to the input terminal 206A of the amplitude sense circuit 206. The current amplifier circuit 204 includes a gain control input terminal 204E coupled to the capacitor 208 and the output terminal 520D of the amplitude sense circuit 520.

Similarly, the sine channel 518 includes a sensor 508 (e.g. a hall effect sensor), an input terminal 509, analog front end (AFE) circuitry 510, and a sine AGC circuit 512. The AFE circuitry 510 is coupled to the input terminal 509 for receipt of sine signals from the AFE circuitry 510 and may include bandpass filter circuitry to limit the bandwidth of signal provided to the sine AGC circuit 512. The sine AGC circuit 512 includes an instance of the linear-to-log conversion circuit 202 coupled to the AFE circuitry 510 and an instance of the current amplifier circuit 204 coupled to the linear-to-log conversion circuit 202. The sine AGC circuit 512 is coupled to the amplitude sense circuit 206 and the angle estimation circuitry 514.

Modifications are possible in the described embodiments, and other embodiments are possible, within the scope of the claims.

What is claimed is:

1. An automatic gain control circuit, comprising:
   a linear-to-log conversion circuit;
   a current amplifier circuit comprising a current input terminal coupled to an output terminal of the linear-to-log conversion circuit; and
   an amplitude sense circuit comprising:
      an input terminal coupled to an output terminal of the current amplifier circuit; and
      an output terminal coupled to a gain control input terminal of the current amplifier circuit.

2. The automatic gain control circuit of claim 1, further comprising:
   a capacitor comprising:
      a first terminal coupled to the output terminal of the amplitude sense circuit; and
      a second terminal coupled to a common voltage source.

3. The automatic gain control circuit of claim 1, wherein the linear-to-log conversion circuit comprises:
   a signal input terminal;
   a first current source;
   a first transistor comprising:
      a first terminal coupled to the signal input terminal; and
      a second terminal coupled to the first current source;
   a second transistor comprising:
      a first terminal coupled to a third terminal of the first transistor; and
      a second terminal coupled to a power supply rail; and
   a first diode-connected transistor comprising:
      a first terminal coupled to a third terminal of the second transistor; and
      a second terminal coupled to a second current source and the output terminal of the linear-to-log conversion circuit.

4. The automatic gain control circuit of claim 3, wherein the linear-to-log conversion circuit comprises:
   a third transistor comprising:
      a first terminal coupled to the second terminal of the first diode-connected transistor; and
      a second terminal coupled to a third current source; and
   a fourth transistor comprising:
      a first terminal coupled to the power supply rail; and
      a second terminal coupled to a third terminal of the third transistor.

5. The automatic gain control circuit of claim 4, wherein the linear-to-log conversion circuit comprises:
   a second diode-connected transistor comprising:
      a first terminal coupled to a third terminal of the fourth transistor; and
      a second terminal coupled to the power supply rail;
   a fifth transistor comprising:
      a first terminal coupled to a third terminal of the second diode-connected transistor; and
      a second terminal coupled to a fourth current source;
   a third diode-connected transistor comprising a first terminal coupled the power supply rail;
   a sixth transistor comprising:
      a first terminal coupled to a second terminal of the third diode-connected transistor;
      a second terminal coupled to the fourth current source; and
      a third terminal coupled to the second terminal of the first diode-connected transistor; and
   a seventh transistor comprising:
      a first terminal coupled to a second terminal of the third diode-connected transistor; and
      a second terminal coupled to the fourth current source.

6. The automatic gain control circuit of claim 5, wherein:
   the signal input terminal is a first signal input terminal;
   the output terminal is a first output terminal; and
   the linear-to-log conversion circuit comprises:
      a second signal input terminal;
      a second output terminal;
      a fifth current source;
      an eighth transistor comprising:
         a first terminal coupled to the second signal input terminal; and
         a second terminal coupled to the fifth current source;
      a resistor comprising:
         a first terminal coupled to the second terminal of the eighth transistor; and
         a second terminal coupled to the second terminal of the first transistor;
      a ninth transistor comprising:
         a first terminal coupled to a third terminal of the eighth transistor; and
         a second terminal coupled to the power supply rail; and
      a fourth diode-connected transistor comprising:
         a first terminal coupled to a third terminal of the ninth transistor; and
         a second terminal coupled to a sixth current source and the second output terminal of the linear-to-log conversion circuit.

7. The automatic gain control circuit of claim 6, wherein the linear-to-log conversion circuit comprises:
   a tenth transistor comprising:
      a first terminal coupled to the second terminal of the fourth diode-connected transistor; and
      a second terminal coupled to the third current source; and
   an eleventh transistor comprising:
      a first terminal coupled to the power supply rail;
      a second terminal coupled to a third terminal of the tenth transistor; and
      a third terminal coupled to the third terminal of the fourth transistor.

8. The automatic gain control circuit of claim 1, wherein the current amplifier circuit comprises:
   a first transistor comprising:
      a first terminal coupled to the current input terminal of the current amplifier circuit; and
      a second terminal coupled to the output terminal of the current amplifier circuit; and
   a second transistor comprising:
      a first terminal coupled a third terminal of the first transistor;
      a second terminal coupled to the gain control input terminal of the current amplifier circuit; and
      a third terminal coupled to a common voltage source.

9. The automatic gain control circuit of claim 8, wherein the current amplifier circuit comprises:
   a third transistor comprising:

a first terminal coupled to a power supply rail; and
a second terminal coupled to the second terminal of the first transistor;
a first diode-connected transistor comprising:
a first terminal coupled to the power supply rail; and
a second terminal coupled to a third terminal of the third transistor;
a fourth transistor comprising a first terminal coupled to a third terminal of the first diode-connected transistor; and
a fifth transistor comprising:
a first terminal coupled to the gain control input terminal of the current amplifier circuit;
a second terminal coupled to a second terminal of the fourth transistor; and
a third terminal coupled to the common voltage source.

10. The automatic gain control circuit of claim 9, wherein the current amplifier circuit comprises:
a second diode-connected transistor comprising a first terminal coupled to the power supply rail;
a sixth transistor comprising:
a first terminal coupled to a second terminal of the second diode-connected transistor; and
a second terminal coupled to the second terminal of the fifth transistor; and
a resistor comprising:
a first terminal coupled to a third terminal of the sixth transistor; and
a second terminal coupled to the second terminal of the first transistor.

11. The automatic gain control circuit of claim 10, wherein:
the current input terminal of the current amplifier circuit is a first current input terminal;
the resistor is a first resistor; and
the current amplifier circuit comprises:
a second current input terminal;
a seventh transistor comprising:
a first terminal coupled to the second current input terminal; and
a second terminal coupled to the first terminal of the second transistor;
an eighth transistor comprising:
a first terminal coupled to the power supply rail;
a second terminal coupled to a third terminal of the seventh transistor; and
a third terminal coupled to the third terminal of the third transistor; and
a second resistor comprising:
a first terminal coupled to the third terminal of the seventh transistor; and
a second terminal coupled to first terminal of the first resistor.

12. An automatic gain control circuit, comprising:
a linear-to-log conversion circuit configured to convert a differential input signal to a first differential output signal that is a logarithmic function of the differential input signal;
a current amplifier circuit coupled to the linear-to-log conversion circuit, and configured to apply a gain to the first differential output signal to produce a second differential output signal; and
an amplitude sense circuit coupled to the current amplifier circuit, and configured to:
compare the differential output signal to a target voltage; and
generate a gain control signal based on a difference of the differential output signal and the target voltage; and
a capacitor coupled to the current amplifier circuit and the amplitude sense circuit, the capacitor configured to:
average the gain control signal over time; and
provide an average gain control signal to the current amplifier circuit to set the gain.

13. The automatic gain control circuit of claim 12, wherein the current amplifier circuit comprises:
a first transistor and a second transistor coupled as a differential pair; and
a third transistor coupled to the first transistor, the second transistor, and the capacitor, and configured to control a tail current in the first transistor and the second transistor based on the average gain control signal.

14. The automatic gain control circuit of claim 13, wherein the current amplifier circuit comprises output common mode circuitry coupled to the first transistor and the second transistor, and configured to:
compare an output common mode voltage to a reference voltage; and
set a first current flowing in the first transistor and a second current flowing in the second transistor to set the output common mode voltage to the reference voltage.

15. The automatic gain control circuit of claim 12, wherein the linear-to-log conversion circuit comprises:
a first signal input transistor;
a second signal input transistor; and
input range control circuitry coupled to the first signal input transistor and the second signal input transistor, and configured to set a common mode voltage provided to the first signal input transistor and the second signal input transistor.

16. The automatic gain control circuit of claim 12, wherein the linear-to-log conversion circuit comprises output range control circuitry configured to:
sense output common mode voltage at a first output terminal and a second output terminal of the linear-to-log conversion circuit;
compare a sensed output common mode voltage to a reference voltage; and
adjust voltage at the first output terminal and the second output terminal based on a difference of the sensed output common mode voltage and the reference voltage.

17. An angular position sensor circuit, comprising:
an input terminal;
analog front-end circuitry coupled to the input terminal; and
an automatic gain control circuit coupled to the analog front-end circuitry, and comprising:
a linear-to-log conversion circuit;
a current amplifier circuit comprising a current input terminal coupled to an output terminal of the linear-to-log conversion circuit;
an amplitude sense circuit comprising:
an input terminal coupled to an output terminal of the current amplifier circuit; and
an output terminal coupled to a gain control input terminal of the current amplifier circuit; and
a capacitor coupled to the output terminal of the amplitude sense circuit.

18. The angular position sensor circuit of claim 17, wherein the current amplifier circuit comprises:

a first transistor and a second transistor coupled as a differential pair; and a third transistor coupled to the first transistor, the second transistor, and the capacitor, and configured to control a tail current in the first transistor and the second transistor based on a voltage across the capacitor.

19. The angular position sensor circuit of claim 18, wherein the current amplifier circuit comprises output common mode circuitry coupled to the first transistor and the second transistor, and configured to:

compare an output common mode voltage to a reference voltage; and set a first current flowing in the first transistor and a second current flowing in the second transistor to set the output common mode voltage to the reference voltage.

20. The angular position sensor circuit of claim 17, wherein the linear-to-log conversion circuit comprises:

a first signal input transistor;

a second signal input transistor; and input range control circuitry coupled to the first signal input transistor and the second signal input transistor, and configured to set a common mode voltage provided to the first signal input transistor and the second signal input transistor; and output range control circuitry configured to:

sense output common mode voltage at a first output terminal and a second output terminal of the linear-to-log conversion circuit;

compare a sensed output common mode voltage to a reference voltage; and adjust voltage at the first output terminal and the second output terminal based on a difference of the sensed output common mode voltage and the reference voltage.

* * * * *